United States Patent [19]

Gunjigake et al.

[11] 4,033,790
[45] July 5, 1977

[54] SOLID DIFFUSION DOPANTS FOR SEMICONDUCTORS AND METHOD OF MAKING THE SAME

[75] Inventors: Koreaki Gunjigake, Machida; Masashi Hasegawa; Hiroshi Oizumi, both of Sagamihara; Yoshio Ogata, Machida, all of Japan

[73] Assignee: Denki Kagaku Kogyo Kabushiki Kaisha, Tokyo, Japan

[22] Filed: July 29, 1976

[21] Appl. No.: 709,815

[52] U.S. Cl. .............................. 148/22; 148/186; 148/189; 252/950; 252/951; 106/69; 106/73.2; 106/286

[51] Int. Cl.² ................ C04B 35/40; H01L 21/223

[58] Field of Search ..148/22, 186, 189; 423/328, 336, 337, 600; 252/950, 951; 106/69, 73.2, 286

[56] References Cited

UNITED STATES PATENTS

| | | | |
|---|---|---|---|
| 3,418,071 | 12/1968 | Seitz | 423/600 X |
| 3,431,066 | 3/1969 | Seitz | 423/600 X |
| 3,681,010 | 8/1972 | Messier et al. | 423/600 X |
| 3,767,745 | 10/1973 | Gazza et al. | 423/600 X |
| 3,785,992 | 1/1974 | Fay et al. | 423/600 X |
| 3,849,344 | 11/1974 | McMurtry et al. | 148/189 X |
| 3,852,086 | 12/1974 | Murata et al. | 148/186 X |
| 3,907,618 | 9/1975 | Rapp | 148/189 |
| 3,931,039 | 1/1976 | Yamashita et al. | 148/189 X |
| 3,931,056 | 1/1976 | Myles et al. | 148/189 X |
| 3,972,838 | 8/1976 | Yamashita et al. | 259/950 X |

*Primary Examiner*—G. Ozaki
*Attorney, Agent, or Firm*—McNenny, Pearne, Gordon, Gail, Dickinson & Schiller

[57] ABSTRACT

Disclosed is a solid diffusion source for the phosphorus doping of semiconductors, which comprises a substance composed of at least one kind of compound $R_2O_3$ selected from the group consisting of $Y_2O_3$, $La_2O_3$ and $Ce_2O_3$ and $P_2O_5$ and containing mainly a compound with a chemical formula $R_2O_3 \cdot 5P_2O_5$.

13 Claims, No Drawings

SOLID DIFFUSION DOPANTS FOR SEMICONDUCTORS AND METHOD OF MAKING THE SAME

BACKGROUND OF THE INVENTION

1. Field of the Invention

This invention relates to solid diffusion dopants for semiconductors and methods of making the same. More particularly, the invention pertains to solid diffusion sources for the phosphorus doping of semiconductors and methods of making the same.

2. Description of the Prior Art

At present, the so-called open tube method is mainly employed for the diffusion of phosphorus into silicon semiconductors and phosphorus containing substances such as red phosphorus, $P_2O_5$, $POCl_3$, $PH_3$ etc. are used as phosphorus diffusion sources. Particularly, $POCl_3$, and $PH_3$ are employed in many cases.

In the diffusion employing such impurity sources, an accurate control of the pressure of vapor from the diffusion source, or the flow rate of a gas when it is used as the diffusion source, is required for controlling the concentration of phosphorus diffusing into the silicon. And this necessitates a precise control of the temperature of the diffusion source, the flow rate of the carrier gas, etc.

Conventional doping methods employing liquid diffusion sources are briefly, as follows. Only vapor emanating from the diffusion source, heated at a temperature, below 600° C, or a mixed gas of the vapor and a very small amount of oxygen or a large amount of inert gas, is introduced into a doping chamber kept at a temperature ranging from 750° to 1200° C to effect therein the diffusion of phosphorus into silicon semiconductors.

In this case, many silicon slices or wafers are usually arranged in the doping chamber for the purpose of enhancement of the doping efficiency. In such a doping procedure, however, the concentration of phosphorus diffusing into the silicon wafers may greatly differ on the sides of gas inlet and outlet in some cases. This is caused by a non-uniform flow of gas in the doping chamber, so that a uniform flow of gas is necessary for uniform diffusion of phosphorus. However, it is very difficult to establish such a uniform flow of gas. Even under the same doping conditions, dispersion is noted in the phosphorus concentration among doping lots or silicon wafers of the same lot or in each silicon wafer.

Further, the gas diffusion sources such as $PH_3$, $PBr_3$, etc. have not only the same disadvantages as the liquid diffusion sources mentioned above but also a disadvantage of high toxicity. Moreover, solid red phosphorus has a defect of fluctuation in composition due to a thermal history of diffusion and $P_2O_5$ has high hygroscopicity which is likely to carse a fluctuation in the vapor pressure. In any case, the phosphorus concentration in the silicon varies widely.

To overcome such shortcomings described above, wafer-shaped, solid dopants, which are equal in size to or a little larger than the silicon wafers, are used in the diffusion of boron in silicon semiconductor. With this method, the dopants and the silicon wafers are alternately disposed in parallel but closely spaced relationship to each other and then simultaneously placed in a doping chamber precisely controlled in temperature. In the doping chamber, a gas containing boron, generated from the dopants reacts with the silicon and the boron diffuses into the silicon wafers. With this method, all the silicon wafers make contact with the gas containing boron, generated from the dopants disposed adjacent thereto, and this eliminates the possibilities of dispersion in the diffused borom concentration resulting from the difference in position among the silicon wafers. Thus, uniform diffusion is easily achieved.

Also in the case of phosphorus, if such a substance is available which remains solid at such a diffusion temperature as mentioned above and can be disposed adjacent to the silicon wafers and which generates a gas containing phosphorus at the diffusion temperature, phosphorus will also make useful diffusion dopants. Recently, inventions of solid diffusion dopants, made for the abovesaid purpose, have been patented.

One of such solid dopant sources is indicated in U.S. Pat. No. 3,849,344, in which the dopant contains a compound $SiO_2.P_2O_5$ or $2SiO_2.p_2O_5$ and the others are proposed in U.S. Pat. Nos. 3,841,927 and Published Application No. B 351,348, in which the dopants contain $Al(PO_3)_3$. However, these solid dopants are all those which are suitable for the diffusion of the so-called high phosphorus concentration region that the surface phosphorus concentration in silicon wafers after predeposition is $10^{20}$ to $10^{21}$ atoms/cm$^3$, and, at a temperature suitable for the diffusion of a region having a surface phosphorus concentration of less than about $10^{20}$ atoms/cm$^3$, a sufficient amount of phosphorus-containing gas is not generated from the dopants and the surface phosphorus concentration in the silicon wafers greatly varies with the place.

SUMMARY OF THE INVENTION

This invention is to provide a solid diffusion source for the phosphorus doping of silicon semiconductors, with exhibits excellent characteristics in the diffusion of a low phosphorus concentration region having a surface phosphorus concentration of lower than $10^{19}$ atoms/cm$^3$ or so after diffusion.

The solid diffusion dopant of this invention comprises a substance which is composed of at least one compound ($R_2O_3$) selected from the group consisting of $Y_2O_3$, $La_2O_3$ and $Ce_2O_3$ and phosphorus pentoxide $P_2O_5$ and contains mainly a compound with a chemical formula $R_2O_3.5P_2O_5$. With the use of this diffusion dopant, it is possible to effect doping in which dispersion in the surface phosphorus concentration in silicon semiconductors is small in the diffusion within a temperature range of from 700° to 950° C.

DESCRIPTION OF THE PREFERRED EMBODIMENTS

The compound $R_2O_3$ employed in this invention may be $Y_2O_3$, $La_2O_3$ or $Ce_2O_3$ alone or may be a solid solution. The compound $R_2O_3.5P_2O_5$ means a crystalline or amorphous substance that the molar ratio of $P_2O_5$ to $R_2O_3$ is about 5 and this compound may contain a small amount of by-product which is formed in the formation of this compound, such, for example, as $R_2O_3.3P_2O_5$. The abovesaid substance mainly containing the compound $R_2O_3.5P_2O_5$ comprises the compound alone or a mixture of the compound and another inorganic compound which is added for the purpose of accelerating sintering or improving the mechanical strength of the resulting molding in such an amount as not to cause a remarked change in the pressure of phosphorus containing vapor evaporated from the compound $R_2O_3.5P_2O_5$ during diffusion.

Other preferred inorganic compounds are metal oxides such, for example, as $SiO_2$, $Al_2O_3$, $ZrO_2$, $ThO_2$, etc. and nitrides and carbides of Si, Zr, Ti, Al, etc. which do not substantially contain elements or oxides such as alkaline metals, lead, iron, etc. which are liable to diffuse as impurities other than phosphorus into silicon semiconductors to exert bad influence on the electrical properties of the semiconductors obtained in the diffusion of phosphorus.

The additive may be either granular or fibrous in shape but the fibrous additive provides for enhanced mechanical strength of the solid dopant. In the case where the solid dopant is in the form of a wafer, the thermal shock resistance of the wafer presents a problem when it is put in and out of the doping chamber of high temperature. To improve the thermal shock resistance of the wafer, the abovesaid fabrous additive is especially preferred. Example of such fibrous materials are silica fiber and silica-alumina fiber and the shape of fiber is particularly preferred to have a diameter of less than $50\mu$ and a fiber length of less than 1cm.

The amount of such inorganic compound added is smaller than 20 wt% with respect to the compound $R_2O_3.5P_2O_5$. And when the amount of the inorganic compound exceeds the abovesaid value, the pressure of the phosphorus containing vapor generated during doping remarkedly changes to make the doping unstable.

The solid dopant retains its solid form when heated at the same temperature as the silicon wafer. The shape of the solid dopant is usually preferred to be substantially the same as the silicon wafer but may be any convenient one as long as it does not exert bad influence on the dispersion of the phosphorus concentration in the silicon wafer.

The compound of $R_2O_3.5P_2O_5$ of this invention can be easily produced by mixing an oxide $Y_2O_3$, $La_2O_3$, $Ce_2O_3$ or $CeO_2$ with orthophosphoric acid and by firing the mixture at 500° to 700° C for about 10 hours. Further, this compound can also be produced by firing a mixture of orthophosphoric acid and a compound which forms the abovesaid oxide when heated, such as oxalate of, for example, Y, La or Ce, and an inorganic salt of nitric acid or the like.

It is also possible to employ, as the $P_2O_5$ source, hydroxyacid of phosphorus such as pyrophosphoric acid, metaphosphoric acid or the like, or an ammonium salt of such acid.

It is preferred that the solid dopant is in the form of wafers, which can be easily obtained by an ordinary sintering, hot-pressing or like molding process and a process of cutting the molding by a diamond cutter or the like into individual wafers.

EXAMPLE 1

362 grams of lanthanum oxide, 1155 grams of 85% phosphoric acid aqueous solution and a small amount of water were carefully mixed together to obtain a slurry mixture, which was dried by heating in a platinum vessel at 110° C for 24 hours. Further, the mixture was fired in an electric furnace at 750° C for 10 hours to obtain 1012 grams of a white solid powder containing mainly a crystalline compound that the molar ratio $P_2O_5/La_2O_3$ was about 5/1.

The solid powder was molded by hot pressing. That is, the solid powder was compacted in a graphite die having an inner diameter of 50 mm and heated at 900° C in a nitrogen atmosphere for 30 minutes under a pressure of 100kg/cm², thereafter being cooled to room temperature to obtain a molding having a porosity of 18%. The molding was sliced by diamond sawing into wafer-shaped dopants 1mm thick.

The dopants thus obtained and P-type silicon wafers (each having a resistivity in the range of from 4 to 10Ω·cm, a thickness in the range of from 0.28 to 0.29mm and a diameter of 50mm) were alternately arranged on a quartz boat at intervals of 6mm. The alternating silicon and dopant wafers were placed in a furnace having a uniform temperature zone controlled to ±0.5° C and a stream of nitrogen (1l/min.) was passed over the silicon and dopant wafers to effect predeposition. After etching of the silicon wafers by a 10% HF aqueous solution for 30 seconds, their sheet resistances were measured.

The results of the measurement are shown in the Table. As is apparent from the table, stable predeposition could be achieved for many hours in low phosphorus concentration regions in which the sheet resistance of the silicon wafer was in the range of from about 20 to 630Ω/□.

EXAMPLE 2

688 grams of cerium oxide (IV), 2306 grams of 85% phosphoric acid aqueous solution and a small amount of water were carefully mixed together to obtain a slurry mixture, which was dried by heating in a platinum vessel at 110° C for 24 hours. Further, the mixture was fired in an electric furnace at 750° C for 10 hours to obtain 2005 grams of a white solid powder containing mainly a crystalline compound that the molar ratio $P_2O_5/Ce_2O_3$ was about 5/1.

The solid powder was molded by hot pressing. That is, the solid powder was compacted in a graphite die having an inner diameter of 50mm and heated at 950° C in a nitrogen atmosphere for 15 minutes under a pressure of 100kg/cm², thereafter being cooled to room temperature to obtain a molding having a porosity of 25%. The molding was sliced by diamond sawing into wafer-shaped dopants 1mm thick.

The dopants thus obtained and P-type silicon wafers (each having a resistivity in the range of from 4 to 10Ω·cm, a thickness in the range of from 0.28 to 0.29mm and a diameter of 50mm) were alternately arranged on a quartz boat at intervals of 6mm. The alternating silicon and dopant wafers were placed in a furnace having a uniform temperature zone controlled to ±0.5° C and a stream of nitrogen (1l/min.) was passed over the silicon and dopant wafers to effect predeposition. After etching of the silicon wafers by a 10% HF aqueous solution for 30 seconds, their sheet resistances were measured.

The results of the measurement are shown in the Table. As is apparent from the table, stable predeposition could be achieved for many hours in low phosphorus concentration regions in which the sheet resistance of the silicon wafer was in the range of from about 73 to 1900Ω/□.

EXAMPLE 3

226 grams of yttrium oxide, 1153 grams of 85% phosphoric acid aqueous solution and a small amount of water were carefully mixed together to obtain a slurry mixture, which was dried by heating in a platinum vessel at 110° C for 24 hours. Further, the mixture was fired in an electric furnace at 600° C for 10 hours to obtain 930 grams of a white solid powder containing mainly a crystalline compound that the molar ratio $P_2O_5/Y_2O_3$ was about 5/1.

The solid powder was molded by hot pressing. That is, the solid powder was compacted in a graphite die having an inner diameter of 50mm and heated at 700° C in a nitrogen atmosphere for 15 minutes under a pressure of 100kg/cm², thereafter being cooled to room temperature to obtain a molding having a porosity of 18%. The molding was sliced by diamond sawing into wafer-shaped dopants 1mm thick.

The dopants thus obtained and P-type silicon wafers (each having a resistivity in the range of from 4 to 10Ω·cm, a thickness in the range of from 0.28 to 0.29mm and a diameter of 50mm) were alternately arranged on a quartz boat at intervals of 6mm. The alternating silicon and dopant wafers were placed in a furnace having a uniform temperature zone controlled to ±0.5° C and a stream of nitrogen (1l/min.) was passed over the silicon and dopant wafers to effect predeposition. After etching of the silicon wafers by a 10% HF aqueous solution for 30 seconds, their sheet resistances were measured.

The results of the measurement are shown in the Table. As is apparent from the table, stable predeposition could be achieved for many hours in low phosphorus concentration regions in which the sheet resistance of the silicon wafer was in the range of from about 152 to 4800Ω/□.

EXAMPLE 4

163 grams of lanthanum oxide, 113 grams of yttrium oxide, 1160 grams of 85% phosphoric acid aqueous solution and a small amount of water were carefully mixed together to obtain a slurry mixture, which was dried by heating in a platinum vessel at 110° C for 24 hours. Further, the mixture was fired in an electric furnace at 600° for 20 hours to obtain 940 grams of a white solid powder containing mainly a crystalline compound that the molar ratio $P_2O_5/(La_2O_3+Y_2O_3)$ was about 5/1.

The solid powder was molded by hot pressing. That is, the solid powder was compacted in a graphite die having an inner diameter of 50mm and heated at 700° C in a nitrogen atmosphere for 30 minutes under a pressure of 100kg/cm², thereafter being cooled to room temperature to obtain a molding having a porosity of 18%. The molding was sliced by diamond sawing into wafer-shaped dopants 1mm thick.

The dopants thus obtained and P-type silicon wafers (each having a resistivity in the range of from 4 to 10Ω·cm, a thickness in the range of from 0.28 to 0.29mm and a diameter of 50mm) were alternately arranged on a quartz boat at intervals of 6mm. The alternating silicon and dopant wafers were placed in a furnace having a uniform temperature zone controlled to ±0.5° C and a stream of nitrogen (1l/min.) was passed over the silicon and dopant wafers to effect predeposition. After etching of the silicon wafers by a 10% HF aqueous solution for 30 seconds, their sheet resistances were measured.

The results of the measurement are shown in Table 1. As is apparent from the table, stable predeposition regions were formed in which the sheet resistance of the silicon wafer was in the range of from about 220 to 224Ω/□.

EXAMPLE 5

12 grams of silica fiber having a mean diameter of 9μ and a mean fiber length of 5mm was added to 300 grams of solid powder of the crystaline compound having the molar ratio $P_2O_5/Ce_2O_3$ of about 5/1, made from cerium oxide (IV) and phosphoric acid in Example 2. The mixture was molded using the same conditions and method as those employed in Example 2, by which was obtained a molding having a porosity of 30%. The molding was sliced by diamond sawing into wafers 1mm thick and 50mm indiameter. Predeposition was achieved by using the same conditions and methods as those of Example 2 and then the sheet resistances of silicon wafers were measured. The results of measurements are shown in Table 1. The dopant of this Example exhibited an excellent doping ability as in Example 2. And the dopant wafer did not crack when heated rapidly to 800° C and cooled rapidly to room temperature.

EXAMPLE 6

In Example 5, silica-alumina fiber (50% silica, 45% alumina and 5% zirconia) having a mean diameter of 15μ was used instead of the silica fiber. The diffusion ability of the dopant of this Example is shown in the Table. The thermal shock resistance of the dopant was also excellent as in the case of employing the silica fiber.

EXAMPLE 7

122 grams of solid powder of the crystalline compound having the molar ratio $P_2O_5/Ce_2O_3$ of about 5/1, prepared in Example 2, and 12 grams of silica powder were mixed together. The mixture was hot-pressed by the same method as in Example 1 at 800° C under a pressure of 50kg/cm² for 15 minutes, by which a molding having a porosity of 17.5% was obtained. The molding was sliced into wafers 1mm thick and 50mm in diameter. The diffusion ability of the wafer, measured by using the same conditions and method as those employed in Example 2, is shown in the Table. With the wafer of this Example, even after 300 times of predeposition effected at 800° C for 30 minutes, the value of the sheet resistance was substantially the same as early ones.

For reference, the diffusion ability of a wafer cut out of a molding composed of 122 grams of the compound having the molar ratio $P_2O_5/Ce_2O_3$ of about 5/1 and 40 grams of silica powder is also shown in the Table. In this case, the diffusion ability is remarkedly lowered. That is, the sheet resistance of a silicon wafer changes with the lapse of time and the phosphorus concentration in the wafer varies widely.

Table

| | Predeposition temperature (°C) | Number of times of diffusion | | | | | |
|---|---|---|---|---|---|---|---|
| | | 1st | | 20th | | 50th | |
| | | Sheet resistance (Ω/□) | Status of wafer | Sheet resistance (Ω/□) | Status of wafer | Sheet resistance (Ω/□) | Status of wafer |
| Example 1 | 800 | 620± 30 | No change observed | 625± 35 | No change observed | 627± 42 | No change observed |
| | 825 | 240± 10 | " | 238± 8 | " | 244± 8 | " |
| | 850 | 82± 5 | " | 82± 3 | " | 83± 3 | " |
| | 900 | 19± 1 | " | 19± 1 | " | 19± 1 | " |
| Example 2 | 750 | 1820±100 | No change observed | 1800± 80 | No change observed | 1910± 80 | No change observed |
| | 800 | 185± 8 | " | 190± 4 | " | 190± 7 | " |
| | 850 | 73± 4 | " | 75± 3 | " | 75± 4 | " |
| Example 3 | 700 | 4500±500 | No change observed | 4300±200 | No change observed | 4700±500 | No change observed |
| | 750 | 1720± 20 | " | 1750± 20 | " | 1750± 50 | " |
| | 800 | 152± 3 | " | 160± 5 | " | 161± 5 | " |
| Example 4 | 825 | 220± 8 | No change observed | 220± 6 | No change observed | 224± 6 | No change observed |
| Example 5 | 800 | 188± 6 | No change observed | 190± 5 | No change observed | 190± 6 | No change observed |
| Example 6 | 800 | 182± 4 | No change observed | 180± 5 | No change observed | 183± 5 | No change observed |
| Example 7 | 800 | 190± 2 | No change observed | 190± 5 | No change observed | 191± 5 | No change observed |
| | 800 | 230± 3 | " | 280± 20 | " | 340±100 | " |

EXAMPLE 8

10 grams of silica powder and 10 grams of silica fiber (having a mean diameter of $9\mu$ and a mean fiber length of 5mm) were added to 295 grams of solid powder of the crystaline compound having the molar ratio $P_2O_6/Ce_2O_3$ of about 5/1, prepared in Example 1 and they are mixed together. The mixture was hot-pressed by the same method as in Example 1 at 800° C under a pressure of 50kg/cm² for 10 minutes, by which a molding having a porosity of 23% was obtained. The molding was sliced into wafers 1mm thick and 50mm in diameter. The diffusion ability of the wafer was tested using the same conditions and method as those employed in Example 2. The sheet resistance was excellent which was substantially equal to that obtained in Example 2. Further, the wafer was not broken when heated rapidly to 800° C and cooled rapidly to room temperature, so that the wafer was excellent in thermal shock resistance, too. Moreover, even after predeposition at 800° C for 30 minutes was repeated 300 times, the sheet resistance exhibited substantially the same value as early ones.

While the invention has been described herein with reference to certain preferred embodiments, it is to be understood that various changes and modifications may be made by those skilled in the art without departing form the concept of the invention, the scope of which is to be determined by reference to the appended claims.

We claim as our invention:

1. A solid phosphorus dopant source for semiconductors, comprising a substance composed of at least one kind of compound $R_2O_3$ selected from the group consisting of $Y_2O_3$, $La_2O_3$ and $Ce_2O_3$ and $P_2O_5$ and containing mainly a compound with a chemical formula $R_2O_3 \cdot 5P_2O_5$.

2. The solid phosphorus dopant source according to claim 1, wherein said compound $R_2O_3$ is a compound $Y_2O_3$.

3. The solid phosphorus dopant source according to claim 1, wherein said compound $R_2O_3$ is a compound $La_2O_3$.

4. The solid phosphorus dopant source according to claim 1, wherein said compound $R_2O_3$ is a compound $Ce_2O_3$.

5. The solid phosphorus dopant source according to claim 1, wherein said substance contains the compound $R_2O_3 \cdot 5P_2O_5$ and less than 20 wt% of an inorganic compound with respect to the former.

6. The solid phosphorus dopant source according to claim 5, wherein said inorganic compound is silica fiber.

7. The solid phosphorus dopant source according to claim 5, wherein said inorganic compound having a diameter of less than $50\mu$.

8. The solid phosphorus dopant source according to claim 5, wherein said inorganic compound is silica-alumina fiber.

9. The solid phosphorus dopant source according to claim 5, wherein said inorganic compound is silica-alumina fiber having a diameter of less than $50\mu$.

10. The solid phosphorus dopant source according to claim 5, wherein said inorganic compound is composed of silica fiber and $SiO_2$.

11. The solid phosphorus dopant source according to claim 5, wherein said inorganic compound is composed of silica fiber and $Al_2O_3$.

12. The solid phosphorus dopant source according to claim 5, wherein said inorganic compound is composed of silica-alumina fiber and $SiO_2$.

13. The solid phosphorus dopant source according to claim 5, wherein said inorganic compound is composed of silica-alumina fiber and $Al_2O_3$.

* * * * *